United States Patent
Malofsky et al.

(10) Patent No.: US 10,607,910 B2
(45) Date of Patent: Mar. 31, 2020

(54) COMPOSITE COMPOSITIONS FOR ELECTRONICS APPLICATIONS

(71) Applicant: Sirrus, Inc., Loveland, OH (US)

(72) Inventors: Bernard Miles Malofsky, Bloomfield, CT (US); Adam Gregg Malofsky, Loveland, OH (US); Matthew McBrayer Ellison, Mason, OH (US)

(*) Notice: Subject to any disclaimer, the term of this patent is extended or adjusted under 35 U.S.C. 154(b) by 413 days.

(21) Appl. No.: 14/648,629

(22) PCT Filed: Nov. 27, 2013

(86) PCT No.: PCT/US2013/072203
§ 371 (c)(1),
(2) Date: May 29, 2015

(87) PCT Pub. No.: WO2014/085570
PCT Pub. Date: Jun. 5, 2014

(65) Prior Publication Data
US 2015/0303122 A1    Oct. 22, 2015

Related U.S. Application Data

(60) Provisional application No. 61/731,850, filed on Nov. 30, 2012.

(51) Int. Cl.
*H01L 23/29* (2006.01)
*H01L 21/56* (2006.01)
(Continued)

(52) U.S. Cl.
CPC .......... *H01L 23/295* (2013.01); *H01L 21/563* (2013.01); *H01L 23/49811* (2013.01);
(Continued)

(58) Field of Classification Search
CPC . H01L 23/295; H01L 21/563; H01L 23/49811
See application file for complete search history.

(56) References Cited

U.S. PATENT DOCUMENTS 2,212,506 A    8/1940    Bachman et al.
2,245,567 A    6/1941    Brant et al.
(Continued)

FOREIGN PATENT DOCUMENTS

CN    102901754 A    1/2013
CN    104995166 A    10/2015
(Continued)

OTHER PUBLICATIONS

U.S. Appl. No. 14/948,734, filed Nov. 23, 2015.
(Continued)

*Primary Examiner* — Mark W Tornow
(74) *Attorney, Agent, or Firm* — Ulmer & Berne LLP

(57) ABSTRACT

An electronics composition includes a curable matrix material and, optionally, a filler material disposed within the matrix material. The cured matrix material includes an oligomer or polymer material derived from a compound selected from a methylene malonate monomer, a multifunctional methylene monomer, a methylene beta ketoester monomer, a methylene beta diketone monomer, or a mixture thereof.

9 Claims, 3 Drawing Sheets

(51) Int. Cl.
*H01L 23/498* (2006.01)
*H01L 23/00* (2006.01)

(52) U.S. Cl.
CPC ...... *H01L 24/09* (2013.01); *H01L 2224/0401* (2013.01); *H01L 2224/16225* (2013.01); *H01L 2224/32225* (2013.01); *H01L 2224/73204* (2013.01); *H01L 2924/1461* (2013.01); *H01L 2924/15192* (2013.01); *H01L 2924/15311* (2013.01)

(56) References Cited

U.S. PATENT DOCUMENTS

| | | |
|---|---|---|
| 2,277,479 A | 3/1942 | D'Alelio |
| 2,313,501 A | 3/1943 | Bachman et al. |
| 2,330,033 A | 9/1943 | D'Alelio |
| 2,403,791 A | 7/1946 | D'Alelio |
| 2,569,767 A | 10/1951 | Knock |
| 2,726,204 A | 12/1955 | Kilbourne et al. |
| 2,730,457 A | 1/1956 | Green et al. |
| 3,042,710 A | 7/1962 | Dickstein et al. |
| 3,140,276 A | 7/1964 | Forster |
| 3,197,318 A | 7/1965 | Halpern et al. |
| 3,203,915 A | 8/1965 | D'Alelio |
| 3,221,745 A | 12/1965 | Coover, Jr. et al. |
| 3,385,777 A | 5/1968 | Haycock et al. |
| 3,427,250 A | 2/1969 | Haas et al. |
| 3,489,663 A | 1/1970 | Bayer et al. |
| 3,523,097 A | 8/1970 | Coover, Jr. et al. |
| 3,557,185 A | 1/1971 | Ito et al. |
| 3,591,676 A | 7/1971 | Hawkins et al. |
| 3,595,869 A | 7/1971 | Shuman |
| 3,677,989 A | 7/1972 | Jenkinson |
| 3,728,373 A | 4/1973 | Imohel et al. |
| 3,758,550 A | 9/1973 | Eck et al. |
| 3,759,797 A | 9/1973 | Masunaga et al. |
| 3,923,836 A | 12/1975 | Bender et al. |
| 3,936,486 A | 2/1976 | Egger et al. |
| 3,940,362 A | 2/1976 | Overhults |
| 3,945,891 A | 3/1976 | Aal et al. |
| 3,966,562 A | 6/1976 | Mukushi et al. |
| 3,975,422 A | 8/1976 | Buck |
| 3,978,422 A | 8/1976 | Rheinfelder |
| 3,995,489 A | 12/1976 | Smith et al. |
| 4,001,345 A | 1/1977 | Gorton et al. |
| 4,004,984 A | 1/1977 | Margen |
| 4,018,656 A | 4/1977 | Rogers et al. |
| 4,035,243 A | 7/1977 | Katz et al. |
| 4,036,985 A | 7/1977 | Amato et al. |
| 4,046,943 A | 9/1977 | Smith et al. |
| 4,049,698 A | 9/1977 | Hawkins et al. |
| 4,056,543 A | 11/1977 | Ponticello |
| 4,079,058 A | 3/1978 | Ackermann et al. |
| 4,080,238 A | 3/1978 | Wolinski et al. |
| 4,083,751 A | 4/1978 | Choi et al. |
| 4,102,809 A | 7/1978 | Smith et al. |
| 4,105,688 A | 8/1978 | Ami et al. |
| 4,118,422 A | 10/1978 | Klein |
| 4,140,584 A | 2/1979 | Margen |
| 4,148,693 A | 4/1979 | Williamson |
| 4,154,914 A | 5/1979 | Kuraya |
| 4,160,864 A | 7/1979 | Ponticello et al. |
| 4,176,012 A | 11/1979 | Bryant |
| 4,186,058 A | 1/1980 | Katz et al. |
| 4,186,060 A | 1/1980 | Katz et al. |
| 4,198,334 A | 4/1980 | Rasberger |
| 4,224,112 A | 9/1980 | Childs |
| 4,229,263 A | 10/1980 | Childs |
| 4,236,975 A | 12/1980 | Childs |
| 4,237,297 A | 12/1980 | Rody et al. |
| 4,243,493 A | 1/1981 | Gruber et al. |
| 4,256,908 A | 3/1981 | Nishimura et al. |
| 4,282,067 A | 8/1981 | Katz et al. |
| 4,282,071 A | 8/1981 | Sherrod |
| 4,291,171 A | 9/1981 | Baum et al. |
| 4,308,335 A | 12/1981 | Yamamoto et al. |
| 4,313,865 A | 2/1982 | Teramoto et al. |
| 4,319,964 A | 3/1982 | Katz et al. |
| 4,329,479 A | 5/1982 | Yabutani et al. |
| 4,396,039 A | 8/1983 | Klenk et al. |
| 4,399,300 A | 8/1983 | Prange et al. |
| 4,411,740 A | 10/1983 | Flaningam et al. |
| 4,440,601 A | 4/1984 | Katz et al. |
| 4,440,910 A | 4/1984 | O'Connor |
| 4,443,624 A | 4/1984 | Prange et al. |
| 4,444,928 A | 4/1984 | Karrer |
| 4,450,067 A | 5/1984 | Angevine et al. |
| 4,483,951 A | 11/1984 | Brenner |
| 4,504,658 A | 3/1985 | Narisada et al. |
| 4,510,273 A | 4/1985 | Miura et al. |
| 4,517,105 A | 5/1985 | Laemmle et al. |
| 4,523,007 A | 6/1985 | Schipfer et al. |
| 4,539,423 A | 9/1985 | Itatani et al. |
| 4,556,649 A | 12/1985 | Salzburg et al. |
| 4,560,723 A | 12/1985 | Millet et al. |
| 4,578,503 A | 3/1986 | Ishikawa et al. |
| 4,584,064 A | 4/1986 | Ciais et al. |
| 4,613,658 A | 9/1986 | Mathias et al. |
| 4,698,333 A | 10/1987 | Fauss et al. |
| 4,720,543 A | 1/1988 | McPherson et al. |
| 4,724,053 A | 2/1988 | Jasne |
| 4,727,801 A | 3/1988 | Yokoi et al. |
| 4,728,701 A | 3/1988 | Jarvis et al. |
| 4,736,056 A | 4/1988 | Smith et al. |
| 4,767,503 A | 8/1988 | Crescentini et al. |
| 4,769,464 A | 9/1988 | Sajtos |
| 4,783,242 A | 11/1988 | Robbins |
| 4,828,882 A | 5/1989 | Tsezos et al. |
| 4,835,153 A | 5/1989 | Kubota et al. |
| 4,840,949 A | 6/1989 | Korbonits et al. |
| 4,897,473 A | 1/1990 | Dombek |
| 4,914,226 A | 4/1990 | Di Trapani et al. |
| 4,931,584 A | 6/1990 | Bru-Magniez et al. |
| 4,932,584 A | 6/1990 | Yamazaki et al. |
| 5,021,486 A | 6/1991 | Galbo |
| 5,039,720 A | 8/1991 | Saatweber et al. |
| 5,064,507 A | 11/1991 | O'Donnell et al. |
| 5,142,098 A | 8/1992 | Bru-Magniez et al. |
| 5,162,545 A | 11/1992 | Etzbach et al. |
| 5,210,222 A | 5/1993 | O'Murchu |
| 5,227,027 A | 7/1993 | Topper |
| 5,259,835 A | 11/1993 | Clark et al. |
| 5,284,987 A | 2/1994 | Sikkenga et al. |
| 5,292,937 A | 3/1994 | Manning et al. |
| 5,312,864 A | 5/1994 | Wenz et al. |
| 5,328,687 A | 7/1994 | Leung et al. |
| 5,334,747 A | 8/1994 | Steffen |
| 5,397,812 A | 3/1995 | Usami et al. |
| 5,426,203 A | 6/1995 | Sohn et al. |
| 5,446,195 A | 8/1995 | Pacifici |
| 5,514,371 A | 5/1996 | Leung et al. |
| 5,514,372 A | 5/1996 | Leung et al. |
| 5,550,172 A | 8/1996 | Regula et al. |
| 5,565,525 A | 10/1996 | Morimoto et al. |
| 5,567,761 A | 10/1996 | Song |
| 5,575,997 A | 11/1996 | Leung et al. |
| 5,582,834 A | 12/1996 | Leung et al. |
| 5,624,669 A | 4/1997 | Leung et al. |
| 5,693,621 A | 12/1997 | Toepfer et al. |
| 5,817,742 A | 10/1998 | Toepfer et al. |
| 5,817,870 A | 10/1998 | Haas et al. |
| 5,886,219 A | 3/1999 | Steffen |
| 5,902,896 A | 5/1999 | Bauer |
| 5,952,407 A | 9/1999 | Rasoul et al. |
| 6,054,606 A | 4/2000 | Irie et al. |
| 6,057,402 A * | 5/2000 | Zhou ............... C08G 59/24 257/E21.503 |
| 6,069,261 A | 5/2000 | Hoffmann et al. |
| 6,096,848 A | 8/2000 | Gololobov et al. |
| 6,106,807 A | 8/2000 | Albayrak et al. |
| 6,143,352 A | 11/2000 | Clark et al. |
| 6,183,593 B1 * | 2/2001 | Narang ............. A61L 15/585 156/327 |
| 6,210,474 B1 | 4/2001 | Romano, Jr. et al. |

(56) References Cited

U.S. PATENT DOCUMENTS

| | | | |
|---|---|---|---|
| 6,211,273 B1 | 4/2001 | Bru-Magniez et al. | |
| 6,225,038 B1 | 5/2001 | Smith et al. | |
| 6,238,896 B1 | 5/2001 | Ozaki et al. | |
| 6,245,933 B1 | 6/2001 | Malofsky et al. | |
| 6,284,915 B2 | 9/2001 | Hirase et al. | |
| 6,291,703 B1 | 9/2001 | Schaerfl, Jr. et al. | |
| 6,300,045 B2 | 10/2001 | Lobo et al. | |
| 6,376,019 B1 | 4/2002 | Leung | |
| 6,395,737 B1 | 5/2002 | Defossa et al. | |
| 6,395,931 B1 | 5/2002 | Carvalho et al. | |
| 6,413,415 B1 | 7/2002 | Weiss et al. | |
| 6,420,468 B2 | 7/2002 | Bru-Magniez et al. | |
| 6,440,461 B1 | 8/2002 | Bru-Magniez et al. | |
| 6,448,337 B1 | 9/2002 | Gaddam et al. | |
| 6,512,023 B1* | 1/2003 | Malofsky | A61L 24/06 424/78.35 |
| 6,518,677 B1 | 2/2003 | Capote et al. | |
| 6,545,097 B2 | 4/2003 | Pinchuk et al. | |
| 6,559,264 B1 | 5/2003 | Konig et al. | |
| 6,610,078 B1 | 8/2003 | Bru-Magniez et al. | |
| 6,613,934 B1 | 9/2003 | Jegelka et al. | |
| 6,673,957 B2 | 1/2004 | Bartek et al. | |
| 6,699,928 B2 | 3/2004 | Cobbley et al. | |
| 6,716,355 B1 | 4/2004 | Hanemaaijer et al. | |
| 6,750,298 B1 | 6/2004 | Bru-Magniez et al. | |
| 6,794,365 B2 | 9/2004 | Al-Obeidi et al. | |
| 6,841,064 B1 | 1/2005 | Weiss et al. | |
| 6,846,783 B2 | 1/2005 | Bartley et al. | |
| 6,936,140 B2 | 8/2005 | Paxton et al. | |
| 7,070,675 B2 | 7/2006 | Schmidt et al. | |
| 7,109,369 B2 | 9/2006 | Nose et al. | |
| 7,169,727 B2 | 1/2007 | Thorman | |
| 7,208,621 B2 | 4/2007 | Nose et al. | |
| 7,226,957 B1 | 6/2007 | Scranton et al. | |
| 7,305,850 B2 | 12/2007 | Tonkovich et al. | |
| 7,450,290 B2 | 11/2008 | Xu et al. | |
| 7,465,773 B2 | 12/2008 | Kodemura et al. | |
| 7,553,989 B2 | 6/2009 | Sawabe et al. | |
| 7,603,889 B2 | 10/2009 | Cypes et al. | |
| 7,610,775 B2 | 11/2009 | Tonkovich et al. | |
| 7,649,108 B2 | 1/2010 | Schal et al. | |
| 7,659,423 B1 | 2/2010 | McArdle | |
| 7,663,000 B2 | 2/2010 | Dekkers et al. | |
| 7,678,847 B2 | 3/2010 | Yan et al. | |
| 7,771,567 B2 | 8/2010 | Rives et al. | |
| 7,829,738 B1 | 11/2010 | Brammer, Jr. et al. | |
| 7,900,558 B2 | 3/2011 | Yokoi | |
| 8,119,214 B2 | 2/2012 | Schwantes et al. | |
| 8,168,213 B2 | 5/2012 | Kangas et al. | |
| 8,206,570 B2 | 6/2012 | Deniau | |
| 8,318,060 B2 | 11/2012 | Sundberg et al. | |
| 8,425,790 B2 | 4/2013 | Sato et al. | |
| 8,425,999 B2 | 4/2013 | McArdle et al. | |
| 8,609,885 B2 | 12/2013 | Malofsky et al. | |
| 8,884,051 B2 | 11/2014 | Malofsky et al. | |
| 8,992,512 B2 | 3/2015 | Richard et al. | |
| 8,993,795 B2 | 3/2015 | Malofsky et al. | |
| 9,108,914 B1 | 8/2015 | Malofsky et al. | |
| 9,181,365 B2 | 11/2015 | Malofsky et al. | |
| 9,217,098 B1 | 12/2015 | Stevenson et al. | |
| 9,220,811 B2 | 12/2015 | Overstreet et al. | |
| 9,221,739 B2 | 12/2015 | Malofsky et al. | |
| 9,234,107 B2 | 1/2016 | Malofsky et al. | |
| 9,334,430 B1 | 5/2016 | Stevenson et al. | |
| 9,481,640 B2 | 11/2016 | McArdle et al. | |
| 9,487,468 B2 | 11/2016 | Malofsky et al. | |
| 9,505,943 B2 | 11/2016 | Overbeek et al. | |
| 9,512,058 B2 | 12/2016 | Malofsky et al. | |
| 9,523,008 B2 | 12/2016 | Malofsky et al. | |
| 9,752,059 B2 | 9/2017 | Malofsky et al. | |
| 2001/0005572 A1 | 6/2001 | Lobo et al. | |
| 2001/0034300 A1 | 10/2001 | Yurugi et al. | |
| 2002/0143128 A1 | 10/2002 | Cabioch et al. | |
| 2002/0151629 A1 | 10/2002 | Buffkin et al. | |
| 2003/0096069 A1 | 5/2003 | D'Alessio | |
| 2003/0199655 A1 | 10/2003 | Yurugi et al. | |
| 2004/0057914 A1 | 3/2004 | Bonda et al. | |
| 2004/0076601 A1 | 4/2004 | Bru-Magniez et al. | |
| 2004/0082043 A1 | 4/2004 | Yadav et al. | |
| 2004/0086243 A1 | 5/2004 | DiGiovanni et al. | |
| 2004/0220060 A1 | 11/2004 | Bartley et al. | |
| 2005/0106781 A1* | 5/2005 | Ogata | H01L 21/563 438/118 |
| 2006/0001158 A1 | 1/2006 | Matayabas, Jr. et al. | |
| 2006/0073334 A1 | 4/2006 | Schwantes et al. | |
| 2006/0167267 A1 | 7/2006 | Chorghade et al. | |
| 2006/0197236 A1* | 9/2006 | Basheer | C08G 59/3227 257/788 |
| 2006/0211809 A1 | 9/2006 | Kodemura et al. | |
| 2006/0264597 A1 | 11/2006 | Mohanty et al. | |
| 2007/0043145 A1 | 2/2007 | Beck et al. | |
| 2007/0049655 A1 | 3/2007 | Yoshimune et al. | |
| 2007/0092483 A1 | 4/2007 | Pollock | |
| 2007/0222051 A1* | 9/2007 | Yoshimura | H01L 25/0657 257/678 |
| 2008/0131618 A1 | 6/2008 | Nakamura et al. | |
| 2008/0160305 A1 | 7/2008 | Warren et al. | |
| 2008/0187655 A1 | 8/2008 | Markle et al. | |
| 2008/0227919 A9 | 9/2008 | Li et al. | |
| 2008/0241485 A1 | 10/2008 | Shimohara et al. | |
| 2008/0286333 A1 | 11/2008 | Kangas et al. | |
| 2009/0087151 A1 | 4/2009 | Benjamin et al. | |
| 2009/0200652 A1 | 8/2009 | Oh et al. | |
| 2009/0203861 A1 | 8/2009 | Lee et al. | |
| 2009/0263604 A1 | 10/2009 | Arai et al. | |
| 2009/0286433 A1 | 11/2009 | Watanabe | |
| 2010/0016508 A1 | 1/2010 | Sasagawa et al. | |
| 2010/0059179 A1 | 3/2010 | Tribelhorn et al. | |
| 2010/0124649 A1 | 5/2010 | Rukavina et al. | |
| 2010/0256720 A1 | 10/2010 | Overstreet et al. | |
| 2010/0286438 A1 | 11/2010 | Malofsky et al. | |
| 2011/0015406 A1 | 1/2011 | Umetani et al. | |
| 2011/0024392 A1 | 2/2011 | Sato et al. | |
| 2011/0164322 A1 | 7/2011 | Morozumi et al. | |
| 2011/0244010 A1 | 10/2011 | Doshi | |
| 2011/0255156 A1 | 10/2011 | Jethmalani et al. | |
| 2012/0083523 A1 | 4/2012 | Richard et al. | |
| 2012/0136130 A1 | 5/2012 | Takashima et al. | |
| 2012/0261807 A1 | 10/2012 | Itoh et al. | |
| 2012/0315388 A1 | 12/2012 | Burckhardt et al. | |
| 2013/0197263 A1 | 8/2013 | Gondi et al. | |
| 2013/0281580 A1 | 10/2013 | Malofsky et al. | |
| 2013/0303719 A1 | 11/2013 | Malofsky et al. | |
| 2013/0310594 A1 | 11/2013 | McConville et al. | |
| 2014/0058031 A1 | 2/2014 | Overbeek et al. | |
| 2014/0173889 A1 | 6/2014 | Johnson et al. | |
| 2014/0248485 A1 | 9/2014 | Malofsky et al. | |
| 2014/0275400 A1 | 9/2014 | Chen et al. | |
| 2014/0288230 A1 | 9/2014 | Malofsky et al. | |
| 2014/0329980 A1 | 11/2014 | Malofsky et al. | |
| 2015/0056879 A1 | 2/2015 | Malofsky et al. | |
| 2015/0104660 A1 | 4/2015 | Malofsky et al. | |
| 2015/0148480 A1 | 5/2015 | Ellison et al. | |
| 2015/0210894 A1 | 7/2015 | Malofsky et al. | |
| 2015/0303122 A1 | 10/2015 | Malofsky et al. | |
| 2015/0361283 A1 | 12/2015 | Malofsky et al. | |
| 2016/0075641 A1 | 3/2016 | McArdle et al. | |
| 2018/0010014 A1 | 1/2018 | Sweet et al. | |
| 2018/0169642 A1 | 6/2018 | Yang et al. | |
| 2018/0170827 A1 | 6/2018 | Yang et al. | |
| 2018/0222839 A1 | 8/2018 | Sullivan et al. | |
| 2019/0100662 A1 | 4/2019 | Gottumukkala et al. | |
| 2019/0161640 A1 | 5/2019 | Gottumukkala et al. | |

FOREIGN PATENT DOCUMENTS

| | | |
|---|---|---|
| DE | 19508049 A1 | 9/1996 |
| DE | 102017204525 A1 | 9/2017 |
| FR | 2788516 A1 | 7/2000 |
| GB | 432628 | 7/1935 |
| GB | 965676 | 8/1964 |
| GB | 965767 | 8/1964 |
| GB | 975733 | 11/1964 |
| JP | S5681537 A | 7/1981 |

(56) References Cited

FOREIGN PATENT DOCUMENTS

| | | |
|---|---|---|
| JP | 02-281013 | 11/1990 |
| JP | H08231564 | 9/1996 |
| JP | 09258448 A | 10/1997 |
| JP | 10279506 A | 10/1998 |
| JP | 200019936 | 7/2000 |
| JP | 2002226316 A | 8/2002 |
| JP | 2003201397 A | 7/2003 |
| JP | 2004-304125 A | 10/2004 |
| JP | 2008174494 | 1/2007 |
| JP | 2009084432 A | 4/2009 |
| JP | 2011-025247 A | 2/2011 |
| JP | 2018193530 A | 12/2018 |
| KR | 101336775 B1 | 11/2013 |
| WO | 1999/046619 | 9/1999 |
| WO | 99/055394 | 11/1999 |
| WO | 2006-098514 A1 | 9/2006 |
| WO | 2007/120630 | 10/2007 |
| WO | 2007120630 A2 | 10/2007 |
| WO | 2008077517 A1 | 7/2008 |
| WO | 2010/129068 A1 | 11/2010 |
| WO | 2011/059104 | 12/2011 |
| WO | 2011/161045 | 12/2011 |
| WO | 2012/054616 A2 | 4/2012 |
| WO | 2012/054633 A2 | 4/2012 |
| WO | 2013059473 A2 | 4/2013 |
| WO | 2013/066629 | 5/2013 |
| WO | 2013/149173 A1 | 10/2013 |
| WO | 2013149165 A1 | 10/2013 |
| WO | 2013149168 A1 | 10/2013 |
| WO | 2017184986 A1 | 10/2017 |
| WO | 2018022785 A1 | 2/2018 |
| WO | 2018022788 A1 | 2/2018 |
| WO | 2018022792 A1 | 2/2018 |
| WO | 2018022794 A1 | 2/2018 |
| WO | 2018022804 A1 | 2/2018 |
| WO | 2018022810 A1 | 2/2018 |
| WO | 2018053454 A1 | 3/2018 |
| WO | 2018053503 A1 | 3/2018 |
| WO | 2018086860 A1 | 5/2018 |
| WO | 2018212330 A1 | 11/2018 |

OTHER PUBLICATIONS

U.S. Appl. No. 15/094,705, filed Apr. 8, 2016.
Bachman et al.: "Diethyl methylenemalonate", May 17, 1939, Eastman Kodak Company, pp. 493-501.
P. Breton et al., "New Poly(Methylidene Malonate 2.1.2) Nanoparticles: Recent Developments", Targeting of Drugs 4, NATO ASI Series, vol. 273, pp. 161-172, 1994.
Limouzin et al., "Anionic Polymerization of n-Butyl Cyanoacrylate in Emulsion and Miniemulsion" Macromolecules, vol. 36, 2003, pp. 667-674.
"Knoevenagel reaction on a molecular sieve", Li Qifang et al., Chinese Science Bulletin, vol. 12, pp. 914-917.
"Knoevenagel Condensation Over Acidic Zeolite", Zuo Bojun et al., Chinese Journal of Catalysis, vol. 23 (6), pp. 555-558.
"Comparison of the catalytic activity of MOFs and zeolites in Knoevenagel condensation", Maksym Opanasenko, et al., Catalysis Science & Technology, vol. 3 p. 500-507.
Corey et al. "Total Synthesis of Gibberellic Acid. A Simple Synthesiss of a Key Intermediate", J. Am. Chem. Soc. 1982, 104, 6129-6130.
Krishna et al. "Stereodefined Access to 3-Deoxy Sugars Through a Tandem Baylis-Hillman and Lewis Acid Catalyzed Reaction Sequence", European Journal of Organic Chemistry, 2010, 813-817.
M. Ware et al.: "DBU: An Efficient Catalyst for Knoeveganel Condensation under Solvent-free Condition," Bulletin of the Catalysis Society of India, (2007), vol. 6, pp. 104-106.
V. G. Nenajdenko et al.: "Reaction of 2-Methylene-1 ,3-Dicarbonyl Compounds Containing a CF3-Group with 1 ,3-Dienes," Tetrahedron, (2000), vol. 56, pp. 6549-6556.
J. S. Yadav et al.: "Phosphane-Catalyzed Knoevenagel Condensation: a Facile Synthesis of a-Cyanoacrylates and a-Cyanoacrylonitriles," Eur. J. Orq. Chem. (2004), pp. 546-551.
B. C. Ranu et al.: "Ionic Liquid as Catalyst and Reaction Medium—a Simple, Efficient and Green Procedure for Knoevenagel Condensation of Aliphatic and Aromatic Carbonyl Compounds Using a Task-Specific Basic Ionic Liquid," Euro. J. Org. Chem., (2006), pp. 3767-3770.
H. A. Oskooie et al.: "On Water: an Efficient Knoevenagel Condensation using 12-Tungstophosphoric Acid as a Reusable Green Catalyst," Synthetic Communications, (2006), vol. 36, pp. 2819-2823.
H. Jiang et al.: "Inorganic Zinc Salts Catalyzed Knoevenagel Condensation at Room Temperature without Solvent," Preparative Biochemistry & Biotechnology, (2009), vol. 39, pp. 194-200.
B. M. Reddy et al.: "An Easy-to-use Heterogeneous Promoted Zirconia Catalyst for Knoevenagel Condensation in liquid Phase under Solvent-Free conditions," Journal of Molecular Catalysis A: Chemical, (2006), vol. 258, pp. 302-307.
D. H. Jung et al.: "New and General Methods for the Synthesis of Arylmethylene Bis(3-Hydroxy-2-Cyclohexene-1-0nes) and Xanthenediones by EDDA and ln(OTf)3-Catalyzed One-Pot Domino Knoevenagel/Michael or Koevenagel/Michael/Cyclodehydration Reactions," Bull. Korean Chem. Soc. (2009) vol. 30, No. 9, pp. 1989-1995.
P. Klemarczyk: "Adhesion Studies of Mixtures of Ethyl Cyanoacrylate with a Difunctional Cyanoacrylate Monomer and with other Electron-deficient Olefins," J. Adhesion, (1999), vol. 69, pp. 293-306.
P. Klemarwczyk: "A General Synthesis of 1,1 Disubstituted Electron Deficient Olefins and their Polymer Properties," Polymer, (1998), vol. 39, No. 1, pp. 173-181.
Gill, Charansingh, et al. "Knoevenagel condensation in neutral media: A simple and efficient protocol for the synthesis of electrophillic alkenes catalyzed by anhydrous ferric sulphate with remarkable reusability." Bulletin of the Catalysis Society of India 7 (2008): 153-157.
P. Ballesteros et al.: "Dl-tert-Butyl Methylenemalonate [Propanedioic Acid, Methylene-, bis(1, 1-dimethylethyl)ester]," Organic Syntheses. Coil. (1990), vol. 7, p. 142 ; (1986) vol. 64, p. 63.
A. M. Vetrova et al.: "Improvement of the Thermal Stability of Cyanoacrylate Adhesives,"Polymer Science, Series D, (2009), vol. 2, No. 1, pp. 27-30.
A. C. Cope: "Condensation Reactions. I. The Condensation of Ketones with Cyanoacetic Esters and the Mechanism of the Knoevenagel Reaction," Condensation of Ketones with Cyanoacetic Esters, (1937), vol. 59, pp. 2327-2330.
G. Lai et al.: "Ionic Liquid Functionalized Silica Gel: Novel Catalyst and Fixed Solvent,"Tetrahedron Letters (2006), vol. 47, pp. 6951-6953.
J. R. Harjani et al.: "Lewis Acidic Ionic Liquids for the Synthesis of Electrophilic Alkenes via the Knoevenagel Condensation," Tetrahedron Letters, (2002), vol. 43, pp. 1127-1130.
P. Ballesteros et al.: "Synthesis of Dl-tert-Butyl Methylenemalonate, a Sterically Hindered 1,1-Dicarbonyl Alkene," J. Org. Chem, (1983), vol. 48, pp. 3603-3605.
T. Doi et al.: "Synthesis of Dimethyl gloiosiphne A by Way of Palladium-Catalyzed Domino Cyclization," J. Org. Chem., (2007), vol. 72, pp. 3667-3671.
Takagi et al.: Kogyo Kagaku Zasshi, Reaction of Active Methylene Radicals with Formaldehyde. L. Synthesis of Diethyl Methylenemalonate, 1953, 56, pp. 901-903, English abstract.
McNab, Kirk-Othmer Encyclopedia of chemical Technology, Pyrolysis, Flash Vacuum, 2009, John Wiley & Sons, Inc., pp. 1-26.
Block, "Diethyl bis (hydroxymethyl) malonate" Organic Syntheses, 1973, Coll. vol. 5, p. 381 [vol. 40, p. 27 (1960); Retrieved on Apr. 4, 2014 from internet: http://www.Orgsyn.org/content/pdfs/procedures/cv5p0381.pdf] p. 381, para 1. 1781-026 WO.
Magdalini Matziari et al. "Active methylene phosphinic peptides: a new diversification approach", Organic Letters., vol. 8, No. 11, 2006, pp. 2317-2319, USACS, Washington DC, ISSN: 1523-7060.
Zaragoza Dorwald, Side Reactions in Organic Synthesis, 2005, Wiley-VCH Verlag GmbH & Co., KgaA, Weinheim, Preface. p. IX.
K. Okamura and T. Date, A Facile Conversion of Ethoxydihydropyrans to 4-Cyanoethylisoxazoles, J. Heterocyclic Chem. 33, 383 (1996).

(56) References Cited

OTHER PUBLICATIONS

Valentine G. Nenajdenko et al, Reaction of 2-Methylene-1,3-dicarbonyl Compounds Containing a CF3-Group with 1,3-Dienes Tetrahedron 56 (2000) 6549-6556.

Yamauchi et al. "Reactivity of 2-methyene-1,3-dicarbonyl compounds: catalytic enantioselective Diels-Alder reaction", Tetrahedron Asymetry 12, (2001), 3113-3118.

Cristoph Schotes et al. "Cu(I)- and C(II)-Catalyzed Cyclo- and Michael Addition Reactions of Unsaturated [beta]-Ketoesters" The Journal of Organic Chemistry, vol. 76, No. 14 dated Jul. 15, 2011 p. 5862-5866.

Alejandro Bugarin et al. "Efficient direct [alpha]-methylenation of carbonyls mediated by dissopropylammonium trifluoroacetate", Chemical Communications, vol. 46, No. 10 dated Jan. 1, 2010.

H. Hoffman et al. "Preparation and Selected Reaction of tery-Butyl 2-Methylene-3-oxoalkanoates" Chem. Ber., vol. 124 dated Jan. 1, 1991, pp. 2475-2480.

M. Yamauchi et al. "Reactivity of 2-Methylene-1, 3-dicarbonyl Compounds. 1,3-Dipolar Cycloaddition Reaction with Ethyl Diazoacetate", Chem. Pham. Bull., vol. 49, No. 12, dated Jan. 1, 2001, pp. 1638-1639.

Lawrence N J et al. "Reaction of Baylis-Hillman products with Swern and Dess-Martin oxidants", Tetrahedron Letters, Pergamon, GB, vol. 42 No. 23 dated Jun. 4, 2001, pp. 3939-3941.

Juliana Vale et al. "Efficient [alpha]-Methylenation of Carbonyl Compounds in Ionic Liquids at Room Temperature", SYNLETT, vol. 2009, No. 01, Jan. 1, 2009 (Jan. 1, 2009), pp. 75-78, XP055170349, ISSN: 0936-5214, DOI: 10.1055/s-0028-1087389 *table 2; compound 3 *.

Weiss et al. Miniemulsion Polymerization as a Means to Encapsulate Organic and Inorganic Materials, Adv. Polymer Science, 2010, pp. 1-52, DOI:10.1007/12_2010_61.

Bhatia, Encapsulation of Particles Using Brittle Subterranean Applications, Thesis submitted to College of Engineering and Mineral Resources at West Virginia University in partial fulfillment of the requirements for the degree of Master of Science in Chemical Engineering, 1999.

McFarland et al, Free Radical Frontal Polymerization with a Microencapsulated Initiator, Macromolecules 2004, vol. 37, pp. 6670-6672.

International Search Report (ISR) and Written Opinion of the Searching Authority in App. No. PCT/US2014/011068 dated May 12, 2014.

International Search Report (ISR) and Written Opinion of the Searching Authority in App. No. PCT/US2011/056903 dated Jun. 7, 2012.

International Search Report (ISR) and Written Opinion of the Searching Authority in App. No. PCT/US2011/056926 dated Feb. 28, 2012.

International Search Report (ISR) and Written Opinion of the Searching Authority in App. No. PCT/US2012/060830 dated Feb. 1, 2013.

International Search Report (ISR) and Written Opinion of the Searching Authority in App. No. PCT/US2012/060840 dated Mar. 12, 2013.

International Search Report (ISR) and Written Opinion of the Searching Authority in App. No. PCT/US2012/060837 dated Jan. 9, 2013.

International Search Report (ISR) and Written Opinion of the Searching Authority in App. No. PCT/US2013/034636 dated Jun. 20, 2013.

International Search Report (ISR) and Written Opinion of the Searching Authority in App. No. PCT/US2013/034641 dated Jun. 25, 2013.

International Search Report (ISR) and Written Opinion of the Searching Authority in App. No. PCT/US2013/034649 dated Aug. 27, 2013.

International Search Report (ISR) and Written Opinion of the Searching Authority in App. No. PCT/US2013/043711 dated Nov. 22, 2013.

International Search Report (ISR) and Written Opinion of the Searching Authority in App. No. PCT/US2013/070355 dated Mar. 19, 2014.

International Search Report (ISR) and Written Opinion of the Searching Authority in App. No. PCT/US2013/072203 dated Apr. 18, 2014.

International Search Report; PCT/US2013/072203; dated Apr. 18, 2014; 2 pages.

M. McCoy, "A New Way to Stick" Chemical & Engineering News, vol. 26, Issue 26 (Jun. 30, 2014), pp. 17-18.

International Search Report (ISR) and Written Opinion of the Searching Authority in App No. PCT/US2015/047445 dated Nov. 30, 2015.

International Search Report (ISR) and Written Opinion of the Searching Authority in App No. PCT/US2015/047466 dated Dec. 1, 2015.

International Search Report (ISR) and Written Opinion of the Searching Authority in App No. PCT/US2015/048846 dated Dec. 4, 2015.

European Search Report of the European Patent Office, Issued in European Application No. 13770173.6-1301 / 2831124; dated Oct. 9, 2015; 7 pages.

European Search Report of the European Patent Office, Issued in European Application No. 13767993.2-1302 / 2831185; dated Jan. 7, 2016; 14 pages.

International Preliminary Report on Patentability in App No. PCT/US2013/070355 dated May 19, 2015.

International Search Report (ISR) and Written Opinion of the Searching Authority in App No. PCT/US2016/027134 dated Jul. 15, 2016, 7 pages in its entirety.

International Search Report (ISR) and Written Opinion of the Searching Authority in App No. PCT/US2016/027099 dated Jul. 15, 2016, 8 pages in its entirety.

International Preliminary Report on Patentability in App No. PCT/US2013/070355 dated May 19, 2015, 6 pages in its entirety.

* cited by examiner

COMPOSITE COMPOSITIONS FOR ELECTRONICS APPLICATIONS

CROSS REFERENCE TO RELATED APPLICATIONS

This application is the United States national phase filing under 35 U.S.C. § 371 of the corresponding international application number PCT/US2013/072203, filed Nov. 27, 2013, and claims the priority benefit of U.S. Provisional Patent Application No. 61/731,850 filed Nov. 30, 2012, entitled "COMPOSITE COMPOSITIONS FOR ELECTRONIC APPLICATIONS" which is incorporated by reference herein in its entirety.

All documents cited or referenced herein and all documents cited or referenced in the herein cited documents, together with any manufacturer's instructions, descriptions, product specifications, and product sheets for any products mentioned herein or in any document incorporated by reference herein, are hereby incorporated by reference, and may be employed in the practice of the invention.

BACKGROUND OF THE INVENTION

Field of the Invention

The present disclosure relates to underfill for chip packages, and more particularly to adhesive electronics materials for integrated circuit chip packages.

Description of Related Art

Integrated circuits are generally constructed as a monolithic silicon chip. In certain constructions, interconnects attach to metalized pads arranged on the surface of the chip to electrically access electronic devices constructed within the chip, thereby realizing the benefit of circuitry within the chip.

The interconnect is typically a conductive structure formed from solder or similar material extending between metalized pads defined on the exterior surface of the chip and complementing connectors on external circuitry. Such interconnects are generally formed using the flip chip processes, e.g. controlled collapse chip connection (C4) process. Solder bumps are formed on the metalized pads on the chip top surface. The chips are then 'flipped' such that the solder bumps are facing the external circuitry. The chip is then aligned with the external circuitry such that the solder bumps are adjacent respective corresponding connectors on the external circuitry. The solder balls are then melted, forming electrical interconnects extending between a gap defined between the chip and external circuitry. Once the electrical interconnects are formed, an underfill composition is introduced into the gap between the chip and external circuit.

Integrated circuits and their interconnects generate heat. This heat induces thermal expansion in the chip, interconnects, and external circuitry. Since these structures are typically formed from different materials with different coefficients of thermal expansion, stresses can develop between the chip and external circuitry. Conventional underfill materials are generally polymer composites or epoxy resins that operate to buffer the electrical interconnects between chip and external circuitry from these stresses. They can include inorganic particles in a polymer matrix such as silica ($SiO_2$) to modify the coefficient of thermal expansion (CTE) of the underfill. This allows for more closely matching the CTE of the underfill to the material used to form the electrical interconnects, thereby reducing stress within interconnects due to thermal expansion.

Conventional underfill composition and methods of packaging chips have generally been considered satisfactory for their intended purpose. However, next generation electronic applications require improved materials and chip construction. Thus, there is a need in the art for improved underfill materials and underfilling methods that have low CTE, high thermal conductivity, moderate modulus, adequate flow properties prior to cure, and tunability of the glass transition temperature of the cured composition. There also remains a need in the art for improved electronics materials, such as underfill compositions, and methods of underfilling gaps between chips and external circuit substrates that are easy to make and use. The present disclosure provides a solution for these problems.

SUMMARY OF THE INVENTION

In one embodiment, there is provided an electronics composition that upon curing, provides a cured electronics material. The electronics material may be incorporated into a chip package, or other electronics structure as an adhesive (bonding agent), coating, or sealant. Some exemplary applications for the electronics material include component bonding on circuit boards and electronics structures, strain relief for electronic components, underfill for circuit boards and chip carriers, wire bonding to circuit boards, wire insulation, chip bonding in chip packages, solder and circuit board masking, conformal coating, chip protective coatings, dielectric layers for chip, component and circuit manufacturing, coating for circuit lithography, resin for circuit board manufacturing (e.g., with glass), radiation protection, optical fiber coating and/or adhesive, porosity sealing of circuit boards and components, sealant during capacitor and other component manufacturing, foil coating, thread locking components on circuit board, and the like.

The electronics composition includes a curable matrix material and, optionally, a filler material depending on the desired application. In an exemplary embodiment, the filler material is disposed in the matrix material. The cured matrix material includes an oligomer or polymer material derived from a compound selected from a methylene malonate monomer, a multifunctional methylene monomer, a methylene beta ketoester monomer, a methylene beta diketone monomer, or any combination thereof.

In certain embodiments, the electronics composition forms a cured electronics material having a coefficient of thermal expansion (CTE) of less than about 30 parts per million per degree Celsius. In other exemplary embodiments, the filler loading in the electronic composition may be tailored to provide a desired CTE in the cured electronics material. The mixture can have a cure temperature of around ambient or room temperature. The electronics composition can have a cure time of less than about 5 minutes. It is contemplated that the electronics composition can be a low-viscosity liquid at room temperature.

In another exemplary embodiment, there is provided an electronics material. The electronics material includes a filler material disposed in a cured matrix material. The cured matrix material includes an oligomer or polymer material derived from a compound selected from a methylene malonate monomer, a multifunctional methylene monomer, a methylene beta ketoester monomer, a methylene beta diketone monomer, or mixtures thereof.

In another exemplary embodiment, there is provided a chip package. The chip package includes at least an electrical interconnect and an electronics material, wherein the electronics material is an underfill. The underfill is disposed about the at least one interconnect. The underfill comprises a filler material disposed within a cured matrix material. The cured matrix material comprises an oligomer or polymer material derived from a compound selected from a methylene malonate monomer, a multifunctional methylene monomer, a methylene beta ketoester monomer, a methylene beta diketone monomer, or combinations thereof.

In certain embodiments, the chip package includes a substrate and a chip. The chip and the substrate can have opposed surfaces that define a gap between the chip and substrate. The underfill can occupy portions of the gap not occupied by the at least one interconnect. The underfill can be an electrically insulating material disposed about the at least one interconnect. The underfill can adhesively couple the chip to the substrate. It is contemplated that one of the chip, substrate, and interconnect can have chemically basic attributes operable to initiate curing of the matrix material. It is further contemplated that a suitable initiator may be introduced to the curable matrix material by other means, such as an applicator or an injection port.

In accordance with certain embodiments, the chip includes an integrated circuit, the substrate includes an external circuit, and the at least one interconnect electrically couples the integrated circuit to the external circuit. The chip can be a first chip, the substrate can be a second chip, and each chip can have an integrated circuit electrically connected to one another by the interconnect.

It is contemplated that the chip is a first chip, the package includes a second chip, and the first and second chips define a second gap between opposing surfaces of the chips. A second interconnect can electrically couple the first chip to the second chip. A second underfill portion can occupy the second gap coupling the second chip to the first chip and be disposed about the second interconnect. It is further contemplated the underfill is an adhesive composition.

These and other features of the systems and methods of the subject disclosure will become more readily apparent to those skilled in the art from the following detailed description of the preferred embodiments taken in conjunction with the drawings.

BRIEF DESCRIPTION OF THE DRAWINGS

So that those skilled in the art to which the subject disclosure appertains will readily understand how to make and use the devices and methods of the subject disclosure without undue experimentation, preferred embodiments thereof will be described in detail herein below with reference to certain figures, wherein.

DETAILED DESCRIPTION OF THE PREFERRED EMBODIMENTS

Figure 1:
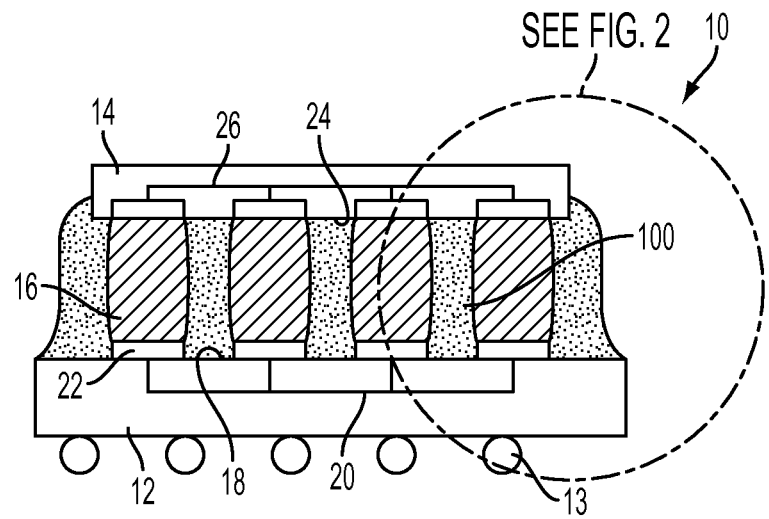
FIG. 1 is a cross-sectional side elevation of a chip package constructed in accordance with the present disclosure, showing the electronics material, according to an embodiment.

Reference will now be made to the drawings wherein like reference numerals identify similar structural features or aspects of the subject disclosure. For purposes of explanation and illustration, and not limitation, a partial view of an exemplary embodiment of an electronics material, utilized as an underfill, in accordance with the disclosure is shown in FIG. 1 and is designated generally by reference character 100. Other embodiments of the composite in accordance with the disclosure, or aspects thereof, are provided in FIGS. 2-4, as will be described. The systems and methods described herein can be used in integrated circuit packaging applications, such as for underfill material in "flip chip" chip-on-substrate (CoS) as well as "chip-on-chip" (CoC) (see FIG. 3) applications.

FIG. 1 shows the cross section of an electronic assembly, e.g., a flip chip package 10. Flip-chip package 10 includes a substrate 12, a chip 14, a plurality of electrical interconnects 16, and an underfill 100. Substrate 10, e.g. a printed circuit board, has a substrate active surface 18, a circuit 20, and a plurality of bonding pads 22. Bonding pads 22 are arranged over a portion of substrate active surface 18 and are electrically connected to an external circuit 20. Chip 14, e.g. a die, has a chip active surface 24, an internal integrated circuit 26, and a plurality of chip contacts 28. Chip contacts 26 are arranged over a portion of chip active surface 24 and are electrically connected to internal integrated circuit 26.

Chip active surface 24 opposes and is offset from substrate active surface 18, thereby defining a gap 30 therebetween. Electrical interconnects 16 are disposed within gap 30 and extend therethrough between corresponding chip contacts 28 and bonding pads 22. This arrangement provides electrical access to integrated circuit 26 for devices external to chip 14. Underfill 100 is also disposed within gap 30 between adjacent electrical interconnects 16 and about a periphery of gap 30. The peripheral region optionally includes a fillet portion 108.

Figure 2:
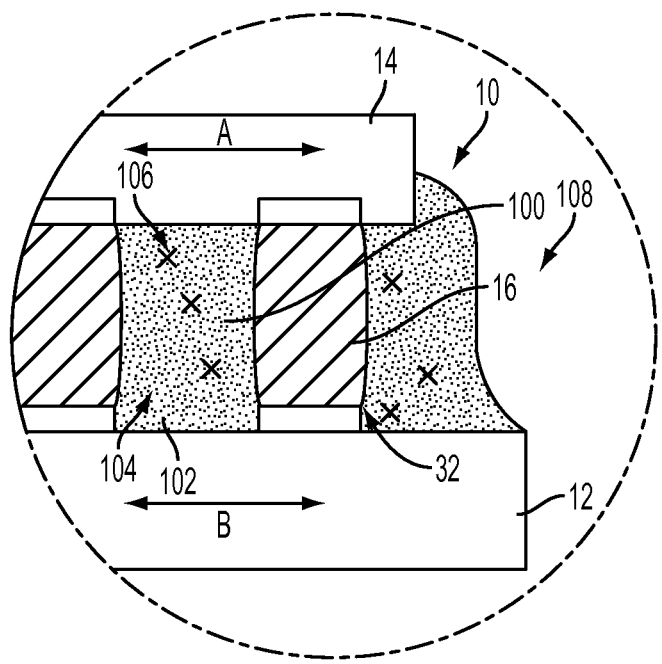
FIG. 2 is a cross-sectional side elevation of the chip package of FIG. 1, showing the matrix and filler materials of the electronics material, according to an embodiment.

Referring now to FIG. 2, a portion of flip chip package 10 is shown including electrical interconnect 16. Electrical interconnect 16 can optionally be formed from a solder ball forced on chip active surface 24 prior to chip 14 being 'flipped' for joining to substrate 12. Underfill 100 includes a matrix material 102 and at least one filler material 104 disposed within a matrix material. Optionally, filler material 104 can be a first filler material and underfill can include a second filler material 106. In an exemplary embodiment, underfill 100 includes a matrix 102 formed from a reaction/cure product of an electronics material comprising an exomethylene derivative compound as disclosed herein and an appropriate filler.

Typically, integrated circuit chips such as chip 14 are constructed from a material with a relatively low coefficient of thermal expansion (CTE), such as silicon, and substrate 12 is constructed from a material with a relatively large CTE, such as an organic material. When exposed to temperature change, such mismatched materials expand at different rates in the X-Y plane (illustrated with strain arrows A and B), the mismatch imposing stress within joint 32 and causing electrical discontinuities.

In aggregate composites it is known that dispersion of inorganic particles in a polymer matrix is useful to achieve improved performance of the polymer composite. Additionally, inorganic material, such as silica ($SiO_2$) can be used to modify the coefficient of thermal expansion (CTE) of polymer composites, underfill materials typically having a cured CTE more closely resembling that of chip 10. This reduced the expansion rate is transmitted to substrate active surface 18, constraining movement in the X-Y plane, and minimizing stresses due to CTE differences. Exemplary embodiments provide sufficient adhesion to the chips and substrate to minimize movement therebetween.

One example of a silica-filled polymer composite is the conventional underfill, or layer of adhesive, used in microelectronics applications. Silica is used to modify the CTE of the adhesive polymer matrix in order to match the CTE of solder material used to join the chip and the substrate in "flip chip" assemblies. Underfill 100 reduces thermal mechanical stress in joints such as joint 32.

Epoxy resins are commonly used in conventional underfill formulations. However, the epoxy materials require special handling and storage conditions. Conventional epoxy resins can also require heat to cure. This heat can potentially impose stress and impart strain in the interconnects extending between the chip and the substrate, potentially reducing the reliability of the chip package. Moreover, each layer of a multilayer CoC device, e.g. a 3D chip package, can require a separate heating cycle to cure successive epoxy underfills. This heat exposure history can also potentially reduce reliability of the chip package. Accordingly, improvements in chip packaging and electronics materials are continuously sought.

Figure 3:
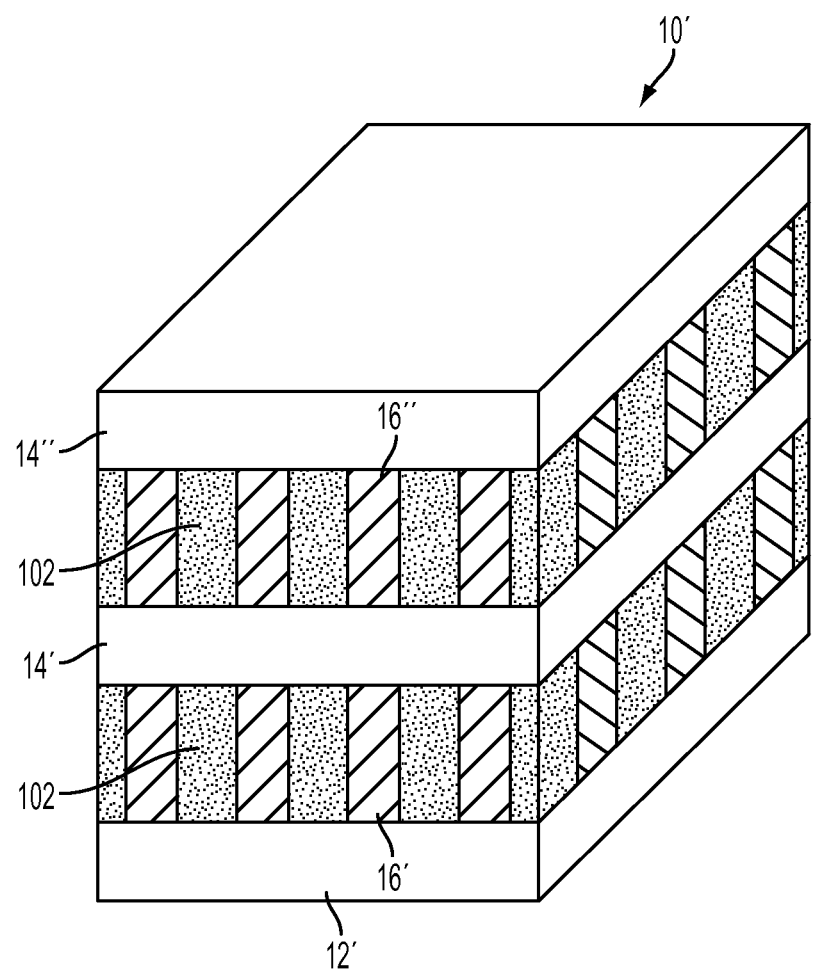
FIG. 3 is a cross-sectional side elevation of a three dimensional chip-on-chip package constructed in accordance with the present disclosure, showing a plurality of underfill portions disposed between respective chips, according to an embodiment.

FIG. 3 illustrates a chip-on-chip (CoC) assembly 10' including a substrate 12', first chip 14' and second chip 14". The assembly 10' includes interconnects 16', 16". Suitable electronic material 102 is disposed between the substrate 10' and first chip 14' and/or between first chip 14' and second chip 14".

Figure 4:
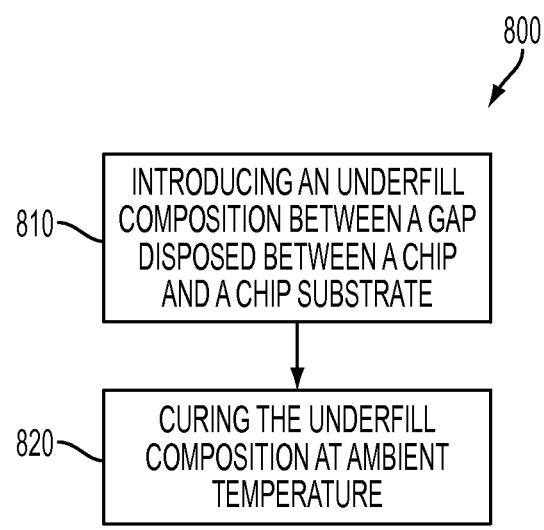
FIG. 4 is a process flow diagram of a process for packaging a chip and a substrate, showing a curing operation according to an embodiment.

FIG. 4 illustrates an exemplary chip manufacturing process. In an exemplary embodiment, an electronic composition (e.g., underfill) is introduced between a gap disposed between a chip and a chip substrate. Thereafter the electronic composition is cured to form a cured electronic material. In an exemplary embodiment, the cure occurs at ambient temperature. In other exemplary embodiments, the cure occurs at room temperature. In other exemplary embodiments, mild heat conditions can be employed to cure the electronic composition.

The materials disclosed herein represent a far-reaching platform. As shown, the materials of interest include methylene malonate monomers, methylene beta diketone monomers, methylene beta ketoesters, and multifunctional monomers, each including one or more exo-methylene reactive groups. Exemplary polymerizable monomer materials include:

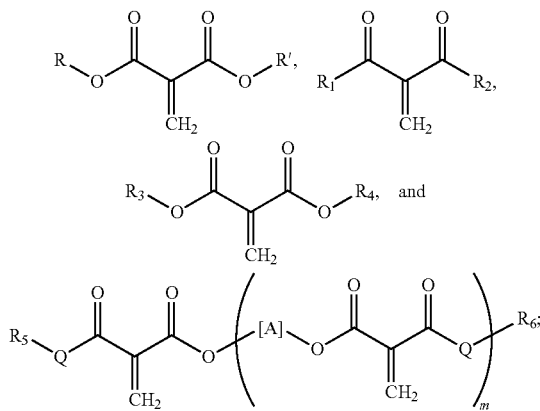

wherein, in the selected formula, R and R', $R_1$ and $R_2$, $R_3$ and $R_4$, and $R_5$ and $R_6$ are independently selected from the group consisting of C1-C15 alkyl, C2-C 15 alkenyl, halo-(C1-C15 alkyl), C3-C6 cycloalkyl, halo-(C3-C6 cycloalkyl), heterocyclyl, heterocyclyl-(C1-C15 alkyl), aryl-(C1-C15 alkyl), heteroaryl or heteroaryl-(C1-C15 alkyl), or alkoxy-(C1-15 alkyl), each of which may be optionally substituted by C1-C15 alkyl, halo-(C1-C15 alkyl), C3-C6 cycloalkyl, halo-(C3-C6 cycloalkyl), heterocyclyl, heterocyclyl-(C1-C15 alkyl), aryl, aryl-(C1-C15 alkyl), heteroaryl, C1-C15 alkoxy, C1-C15 alkylthio, hydroxyl, nitro, azido, cyano, acyloxy, carboxy, or ester;

or wherein in the selected formula, R and R', $R_1$ and $R_2$, or $R_3$ and $R_4$ are taken together with the atoms to which they are bound to form a 5-7 membered heterocyclic ring which may be optionally substituted by C1-C15 alkyl, halo-(C1-C15 alkyl), C3-C6 cycloalkyl, halo-(C3-C6 cycloalkyl), heterocyclyl, heterocyclyl-(C1-C 15 alkyl), aryl, aryl-(C1-C15 alkyl), heteroaryl, C1-C15 alkoxy, C1-C15 alkylthio, hydroxyl, nitro, azido, cyano, acyloxy, carboxy, or ester;

or wherein in the selected formula -[A]- represents —(CRARB)n-, —(CRARB)n-O(C=O)—(CH2)1-15-(C=O)O—(CRARB)n-, —(CH2)n-[CY]—(CH2)n, a polybutadienyl linking group, a polyethylene glycol linking group, a polyether linking group, a polyurethane linking group, an epoxy linking group, a polyacrylic linking group, or a polycarbonate linking group;

wherein each instance of RA or RB is independently H, C1-C15 alkyl, C2-C15 alkenyl, a moiety represented by the formula:

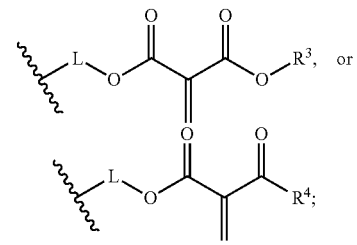

wherein -L- is a linking group selected from the group consisting of alkylene, alkenylene, haloalkylene, cycloalkylene, cycloalkylene, heterocyclylene, heterocyclyl alkylene, aryl-alkylene, heteroarylene or heteroaryl-(alkylene), or alkoxy-(alkylene), each of which may be optionally branched and each of which may be optionally substituted by alkyl, haloalkyl, cycloalkyl, halo cycloalkyl, heterocyclyl, heterocyclyl-(alkyl), aryl, aryl-(alkyl), heteroaryl, C1-C15 alkoxy, C1-C 15 alkylthio, hydroxyl, nitro, azido, cyano, acyloxy, carboxy, ester, each of which may be optionally branched;

$R^3$ is independently selected from the group defined in R6 above; and $R^4$ is alkyl, alkenyl, haloalkyl, cycloalkyl, halo cycloalkyl, heterocyclyl, heterocyclyl alkyl), aryl-(alkyl), heteroaryl or heteroaryl-(alkyl), or alkoxy-(alkyl), each of which may be optionally branched and each of which may be optionally substituted by alkyl, haloalkyl), cycloalkyl, halo cycloalkyl, heterocyclyl, heterocyclyl-(alkyl), aryl, aryl-(alkyl), heteroaryl, C1-C15 alkoxy, C1-C15 alkylthio, hydroxyl, nitro, azido, cyano, acyloxy, carboxy, ester, each of which may be optionally branched;

[CY]— represents an alkyl, alkenyl, haloalkyl, cycloalkyl, halo cycloalkyl, heterocyclyl, heterocyclyl alkyl), aryl-(alkyl), heteroaryl or heteroaryl-(alkyl), or alkoxy-(alkyl) group n is an integer from 1 to 25;

m is an integer from 1 to 25;
each instance of Q represents —O— or a direct bond.

The platform of materials allows for a wide range of glass transition temperatures (Tg). For example, certain embodiments of the cured materials exhibit a glass transition temperature (Tg) greater than 50° C., greater than 80° C., or greater than 100° C. In an exemplary embodiment the material exhibits high solvent resistance. In certain exemplary embodiments the material has a decomposition temperature of at least about 200° C.

The polymerizable monomer compositions (polymerizable compositions) disclosed herein are able to form oligomers and polymers having repeat units as provided below:

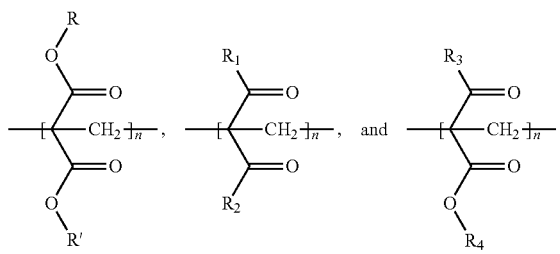

These classes of compounds and their associated monomeric and polymeric-based products would be useful in electronics applications, such as in underfill 100, and other applications disclosed herein.

Certain monomers and monomer blends were tested for compatibility with exemplary fillers. The results are summarized below.

Compatibility Testing: Various Silica Samples with Blended Monomers

Target: 10 wt % content for silica in sample TXD026144 (monomer blend comprising up to 10 wt % difunctional monomer in DEMM monomer.

| Silica Source | Compatible? |
| --- | --- |
| Cabosil TS-720 | yes |
| Cabosil TS-610 | yes |
| Cabosil CT-1221 | yes |
| Aerosil R972 | yes |
| Aerosil R812 | yes |
| Aerosil R202 | yes |
| Aerosil R8125 | yes |
| Aerosil R711 | yes |
| Aerosil R208 | yes |
| Aerosil R106 | yes |

Additional Compatibility Testing: DEMM Monomer

| Silica Sample | Compatible? |
| --- | --- |
| Silica phenyl silane | yes |
| Silica methacryl silane | yes |
| Alumina | Reactive* |
| High Purity Alumina | Reactive* |

*surface of sample may be amenable to treat with silane to improve compatibility, additionally, the monomer can be over-stabilized with MSA to permit increased filler loading of "reactive" samples Improved methods of synthesis of methylene malonate monomers are disclosed in published patent applications on improved methods of synthesis of methylene malonates, namely, WO 2012/054616 Synthesis of Methylene Malonates Substantially Free of Impurities, and WO 2012/054633 Synthesis or Methylene Malonates Using Rapid Recovery in the Presence of a Heat Transfer Agent, each of which are incorporated herein by reference in its entirety. The synthesis procedures provided therein result in improved yields of heretofore elusive high quality methylene malonates and other curable compositions. Other exemplary monomeric species have been made by certain inventors of the present invention and are disclosed, for example, in co-pending patent applications PCT/U.S. Ser. No. 12/06830, entitled "Multifunctional Monomers, Methods For Making Multifunctional Monomers, Polymerizable Compositions And Products Formed Therefrom,"; PCT/U.S. Ser. No. 12/60837, entitled "Methylene Beta-Ketoester Monomers, Methods for Making Methylene Beta-Ketoester Monomers, Polymerizable Compositions and Products Formed Thereform,"; and PCT/U.S. Ser. No. 12/60840, entitled "Methylene Beta-Diketone Monomers, Methods for Making Methylene Beta-Diketone Monomers, Polymerizable Compositions and Products Formed Therefrom, each of which is incorporated herein its entirety.

These compositions are useful in applications as described in The Chemistry and Physics of Underfill, Dr. Ken Gilleo, ET-Trends, Selecting an underfill for flip chip packaging, Dr. Ignatious J. Rasiah, and Chapter 11, Wood-based Composite Materials, Panel Products, Glued-Laminated Timber, Structural Composite Lumber, and Wood-Nonwood Composte Materials, Nicole M. Stark, Zhiyong Cai, Charles Carll, each of which is incorporated herein in its entirety.

In one aspect of the invention, there is provided an electronics material comprising a curable matrix material including at least one of a methylene malonate, a multifunctional methylene monomer, a methylene beta ketoester, a methylene beta diketone, or combinations thereof, and at least one CTE-modifying agent (i.e. a filler) wherein the CTE-modifying agent or agents is/are present in an amount suitable to provide the electronics material, when cured, with a CTE of less than about 30 ppm/degree C.

In another aspect of the invention, there is provided a underfill for an electrical assembly (i.e. a chip and/or a substrate), wherein the underfill comprises a product formed by curing a methylene malonate, a multifunctional methylene monomer, a methylene beta-ketoester, a methylene beta-diketone, or mixtures thereof.

In another aspect of the invention, there is provided a method of making an electronic assembly comprising: providing an electronic component and a substrate, wherein one of the electronic component and the substrate has a plurality of solder bumps and the other has a plurality of electrical bonding pads; electrically connecting the electronic component and the substrate; providing an electronics composition between the electronic component and the substrate; and curing the electronics composition to form an electronics material, wherein the electronics composition comprises a methylene malonate monomer, a multifunctional methylene monomer, a methylene beta-ketoester monomer, a methylene beta-diketone monomer, or combinations thereof.

In another aspect of the invention, there is provided an electronic assembly comprising an electronic component electrically connected to a substrate with an electronics material between the electronic component and the substrate, wherein the electronics material comprises a product formed by curing a curable electrical composition comprising a methylene malonate monomer, a multifunctional methylene monomer, a methylene beta-ketoester monomer, a methylene beta-diketone monomer, or combination thereof.

Exemplary embodiments disclosed herein include a curable composition, resin or formulation for use as electronics material comprising (a) a curable matrix material comprising an exo-methylene functionality and (b) at least one filler material, e.g., a CTE-modifying agent. In an exemplary embodiment, the curable matrix material is amendable to anionic polymerization upon exposure to a suitable initiator or activator. Thus, bases, or materials with chemically basic attributes, may be utilized as cure initiators or activators.

In an exemplary embodiment, it is envisioned that suitable initiators for the reactive matrix material disclosed herein may be incorporated within the substrate or in any component which the reactive matrix material will contact in the chip assembly process.

In other exemplary embodiments, the initiator may be carried in the electronics material in an "inert state" or non-active state until acted on by heat, UV radiation, or other activating mechanism. As used herein, "inert state" means that the initiator may be in a temporary unreactive form, or it may be encapsulated or otherwise isolated from being able to initiate cure until an activating event, e.g., heat, radiation, chemical or physical change, occurs. For example, the imitator may be encapsulated in a wax.

In an exemplary embodiment, the electronics material may be a low-viscosity, homogenous or non-homogenous, liquid at room temperature. Solid, particulate materials, such as fillers may be incorporated in the electronics material for providing various modifications to the physical properties of the uncured or cured polymer. For example, a CTE-modifying agent is included to minimize CTE differences between the underfill and the electronic components, i.e., modify CTE as compared to the CTE of the neat polymer matrix material. Other optional materials may be included to obtained desired chemical and physical properties.

In an exemplary embodiment, for certain electronics applications, the filler may include electrically conductive material, such that electrical connections can be made between first and second components.

In another exemplary embodiment, for certain electronics applications, the filler may include thermally resistant material.

The electronics material disclosed herein may thus be tailored through use of fillers to meet the requirements of the desired application.

In an exemplary embodiment, the electronics material is able to fill small gaps without application of high pressures, vacuum assist, or heating to high temperatures, although such measures are not necessarily excluded. This potentially allows for constructing contiguous underfill bodies, i.e. without voids between substrates and chips. It can potentially accommodate finely pitched arrays of small interconnect structures between chips and substrates.

Exemplary embodiments disclosed herein include polymerizable monomers, curable electronics materials including exo-methylene derivative compounds, partially cured compositions including exo-methylene derivative compounds, and cured underfill including exo-methylene derivative compounds. For example, an exemplary embodiment includes a partially cured composition which may be in the form of a film that is utilized in an electronics assembly, and is subsequently fully cured.

Exemplary embodiments disclosed herein also include methods for assembling electronic components including providing an electronics composition and curing such composition to provide electronics material. The electronics material can be an adhesive electronics material that restricts thermal expansion of one chip package component to more closely conform to that of another component as a result of current flow through the components. This can potentially relieve stress and prevent strain at joints formed by electrical interconnects extending between the components. The underfill can further operate to transfer heat from the chip package, such as by providing a lateral heat conduit for transferring heat out of the chip package. The underfill can Exemplary formulations may be used to attach a variety of electronic components to a variety of substrates. Suitable electronic components include, but are not limited to, dies, capacitors, resistors and the like. It is further contemplated that the underfill can be used to adhesively couple MEMS devices to substrates and/or chips. As used herein, the term "die" refers to a workpiece that is transformed by various processes into a desired integrated circuit device. Dies are usually singulated from a wafer which may be made of a semiconducting material, a non-semiconducting material, or combinations thereof. Suitable substrates include, without limitation, printed circuit boards and flexible circuits. Electrical assemblies prepared by methods disclosed herein also include a package bonded to a substrate. A "package" refers to an integrated circuit placed on a thin circuit board and encapsulated. The package typically contains solder balls on the bottom of the board that are used to form electrical interconnects with the substrate.

One of the electronic component and the substrate has a plurality of solder bumps and the other has a plurality of electrical bonding pads. As used herein, the term "solder bumps" includes solder bumps, solder balls, pins and pillars such as copper pillars. Solder bumps include ball grid arrays and pin grid arrays. Solder bumps may be composed of any suitable solderable material, such as, but not limited to, tin, tin-lead, tin-bismuth, tin-silver, tin-silver-copper, tin-indium and copper. Particularly useful solder bumps are those composed of tin, tin-lead, tin-silver and tin-silver-copper. The tin-alloy solder bumps are typically eutectic mixtures. For example, a suitable tin-silver solder bump has the composition of 96.5% tin and 3.5% silver. Solder bumps may be deposited by any conventional means, such as a paste or by electroplating. Solder bumps composed of alloys may be deposited directly as an alloy, such as by electroplating a Sn—Ag solder bump, or by sequentially depositing a first metal such as tin and then depositing a second metal, such as silver, on the first metal followed by reflowing the metal to form an alloy. Suitable electrical bonding pads may be any suitable pad and may be flush with the surface of the substrate or the electronic component or may be surface of the substrate of the electronic component. Suitable bonding pads may be copper, silver, gold or any other suitable metal.

In use, the solder bumps and bonding pads are fluxed to ensure good solderability. Any suitable flux may be used and is within the ability of those skilled in the art. The electronic component and the substrate are positioned such that the solder bumps and bonding pads are aligned. The assembly is then heated to reflow the solder and electrically connect (that is, solder) the electronic component and the substrate. The particular solder reflow temperature depends on the solder bump composition and is well known to those skilled in the art.

After the electronic component is soldered to the substrate, the electronics material is flowed between the electronic component and the substrate. The electronics material also flows around the solder joints. The electronics material may be applied via a number of methods depending on the end application. For example, typical application methods include syringe or cartridge dispensing for underfill applications.

Once the electronics material fills the space between the electronic component and the substrate, the electronics material is then cured. In exemplary embodiments, the cure is initiated at ambient temperature. In other exemplary embodiments, the electronics material may be cured at a predetermined temperature for a predetermined period of time sufficient to cure the composition. The particular curing conditions are composition specific. In exemplary embodiments, the electronics material cures in less than five minutes. In other exemplary embodiments, the cure time may be tailored to achieve a desired "open" or working time.

Exemplary electronics materials include fillers to improve thermo-mechanical properties of the cured system imparting better component reliability performance. For example, CTE-modifying gents may be utilized to increase the modulus of the cured underfill and reduce the CTE of the adhesive (cured underfill) in order to better match the CTE of the electronic component and the substrate. Exemplary fillers include, without limitation, fused silica, natural silica, synthetic silica, natural aluminum oxide, synthetic aluminum oxide, hollow fillers, aluminum trihydroxide, aluminum hydroxide oxide, boron, silicon carbide, mica, aluminum powder, zinc oxide, silver, graphite, aluminum nitride, mullite, gold, carbon, carbon nanotubes, graphene, glass fibers/sheets, carbon fibers, or other organic or inorganic particulate filler, either added into the formulation in their end state or formed in-situ. Silica, whether fused, natural or synthetic, is a preferred filler. The surface of the fillers may optionally be treated to improve filler and monomer and/or polymer interaction. The filler material generally may range from nano to conventional micro size.

Fillers may have any acceptable form such as, without limitation, platelet, fibrous, spherical, needle, amorphous or any combination thereof. Fillers with different size and different shape may be combined to have a synergistic effect on coefficient of thermal expansion, modulus, electrical and/or heat conductivity.

Compositions described herein are suitable for applications wherein the chip (die) is directly mounted on and electrically interconnected to its final circuit board instead of being packaged as an individual integrated circuit.

The methods and systems of the present disclosure, as described above and shown in the drawings, provide for chip packages with superior properties including reduced interconnect stress and room temperature cure conditions. While the apparatus and methods of the subject disclosure have been shown and described with reference to preferred embodiments, those skilled in the art will readily appreciate that changes and/or modifications may be made thereto without departing from the spirit and scope of the subject disclosure.

What is claimed is:

1. An electronic assembly comprising:
    an electronic component comprising a plurality of electrical interconnects;
    a substrate comprising a plurality of electrical bonding pads; and
    a first composition disposed between the electronic component and the substrate, the first composition comprising:
        an oligomer or polymer formed from one or more of a methylene malonate monomer, a methylene beta ketoester monomer, a methylene beta diketone monomer, a di-alkyl di-substituted vinyl monomer, and a di-haloalkyl di-substituted vinyl monomer; and
        a filler material; and
    wherein each of the plurality of electrical interconnects are respectively electrically bonded to one of the plurality of electrical bonding pads.

2. The electronic assembly of claim 1, wherein the first composition has a coefficient of thermal expansion of about 30 parts per million, per degree Celsius or less.

3. The electronic assembly of claim 1, wherein the first composition is electrically insulating.

4. The electronic assembly of claim 1, wherein the first composition is an adhesive underfill to the electronic component.

5. The electronic assembly of claim 1, wherein the filler material comprises one or more of an electrically conductive filler and a coefficient of thermal expansion filler.

6. The electronic assembly of claim 5, wherein the coefficient of thermal expansion filler comprises one or more of fused silica, natural silica, synthetic silica, natural aluminum oxide, synthetic aluminum oxide, hollow fillers, aluminum trihydroxide, aluminum hydroxide, boron, silicon carbide, mica, aluminum powder, zinc oxide, silver, graphite, aluminum nitride, mullite, gold, carbon, carbon nanotubes, graphene, glass fibers, and carbon fibers.

7. The electronic assembly of claim 1, wherein the electronic component is an integrated circuit chip.

8. The electronic assembly of claim 7, wherein:
    the integrated circuit chip is a first chip and further comprises a second plurality of electrical bonding pads; and
    wherein the electronic assembly further comprises:
        a second integrated circuit chip, the second integrated circuit chip comprising a second plurality of electrical interconnects; and
        a second composition disposed between the first chip and the second integrated circuit chip; and
    wherein each of the second plurality of electrical interconnects are respectively electrically bonded to one of the second plurality of electrical bonding pads.

9. The electronic assembly of claim 8, wherein the first composition and the second composition are the same.

* * * * *